(12) United States Patent
Ohyama et al.

(10) Patent No.: US 11,476,447 B2
(45) Date of Patent: Oct. 18, 2022

(54) FOLDABLE CIRCULAR POLARIZING PLATE AND DISPLAY DEVICE

(71) Applicants: SAMSUNG ELECTRONICS CO., LTD., Suwon-si (KR); DIC Corporation, Tokyo (JP)

(72) Inventors: Tsuyoshi Ohyama, Suwon-si (KR); Seung Hyun Lee, Yongin-si (KR); Hyun-Seok Choi, Seoul (KR); Hidetoshi Nakata, Saitama (JP); Toru Ishii, Chiba (JP)

(73) Assignees: SAMSUNG ELECTRONICS CO., LTD., Gyeonggi-Do (KR); DIC CORPORATION, Tokyo (JP)

( * ) Notice: Subject to any disclaimer, the term of this patent is extended or adjusted under 35 U.S.C. 154(b) by 203 days.

(21) Appl. No.: 16/472,605

(22) PCT Filed: Dec. 22, 2016

(86) PCT No.: PCT/KR2016/015127
§ 371 (c)(1),
(2) Date: Jun. 21, 2019

(87) PCT Pub. No.: WO2018/117302
PCT Pub. Date: Jun. 28, 2018

(65) Prior Publication Data
US 2021/0135168 A1 May 6, 2021

(51) Int. Cl.
*H01L 51/52* (2006.01)
*G02B 5/00* (2006.01)
(Continued)

(52) U.S. Cl.
CPC .......... *H01L 51/5281* (2013.01); *G02B 5/003* (2013.01); *G02B 5/3016* (2013.01);
(Continued)

(58) Field of Classification Search
CPC ............ H01L 51/5281; H01L 27/3244; H01L 51/0097; H01L 2251/5338; G02B 5/003;
(Continued)

(56) References Cited

U.S. PATENT DOCUMENTS 6,565,974 B1   5/2003  Uchiyama et al.
RE39,753 E     7/2007  Uchiyama et al.
(Continued)

FOREIGN PATENT DOCUMENTS

JP   2002071956 A   3/2002
JP   3325560 B2     7/2002
(Continued)

OTHER PUBLICATIONS

Japanese Office Action—Japanese Patent Application No. 2019-533345 dated Jun. 16, 2020.
(Continued)

*Primary Examiner* — Anthony J Frost
(74) *Attorney, Agent, or Firm* — Cantor Colburn LLP

(57) ABSTRACT

A foldable circular polarizing plate includes a polarizer and a foldable compensation film disposed on one surface of the polarizer, wherein in-plane retardations of the liquid crystal layer at 450 nm, 550 nm, and 650 nm wavelengths satisfy Relationship Equations 1 or 2, the compensation film is configured to absorb light in a wavelength region of less than or equal to 420 nm, and a reflection color in a CIE-Lab color coordinate system satisfies $\Delta a^* b^* \leq 5.0$ and a foldable organic light emitting diode display including the same.

$R_e(450\ nm) < R_e(550\ nm) \leq R_e(650\ nm)$  [Relationship Equation 1]

$R_e(450\ nm) \leq R_e(550\ nm) < R_e(650\ nm)$  [Relationship Equation 2]

14 Claims, 4 Drawing Sheets

(51) Int. Cl.
*G02B 5/30* (2006.01)
*H01L 27/32* (2006.01)
*H01L 51/00* (2006.01)

(52) U.S. Cl.
CPC ........ *G02B 5/3025* (2013.01); *H01L 27/3244* (2013.01); *H01L 51/0097* (2013.01); *C09K 2323/00* (2020.08); *G02B 5/3083* (2013.01); *H01L 2251/5338* (2013.01)

(58) Field of Classification Search
CPC . G02B 5/3025; G02B 5/3016; C09K 2323/00
See application file for complete search history.

(56) References Cited

U.S. PATENT DOCUMENTS

| | | | |
|---|---|---|---|
| 8,119,026 B2 | 2/2012 | Parri et al. | |
| 9,064,826 B2 | 6/2015 | Nakazawa | |
| 9,250,371 B2 | 2/2016 | Won et al. | |
| 9,664,833 B2 | 5/2017 | Kobayashi et al. | |
| 9,696,475 B2 | 7/2017 | Hatanaka et al. | |
| 10,139,540 B2 | 11/2018 | Hatanaka et al. | |
| 2013/0114136 A1* | 5/2013 | Saito | G03B 35/26 359/465 |
| 2014/0126053 A1 | 5/2014 | Won et al. | |
| 2014/0160404 A1* | 6/2014 | Yamada | G02B 5/223 349/96 |
| 2015/0064367 A1* | 3/2015 | Choi | G02B 1/08 428/1.31 |
| 2015/0079380 A1* | 3/2015 | Muramatsu | C09K 19/2028 428/220 |
| 2015/0131031 A1* | 5/2015 | Kim | G02B 5/3016 349/75 |
| 2015/0218454 A1* | 8/2015 | Kobayashi | C09K 19/3852 349/194 |

FOREIGN PATENT DOCUMENTS

| | | |
|---|---|---|
| JP | 2010060618 A | 3/2010 |
| JP | 2010522892 A | 7/2010 |
| JP | 2012077057 | 4/2012 |
| JP | 2014115524 A | 6/2014 |
| JP | 2015143790 | 8/2015 |
| JP | 2015163940 | 9/2015 |
| JP | 2016166344 | 9/2016 |
| KR | 100648183 B1 | 11/2006 |
| KR | 1020140058386 A | 5/2014 |
| KR | 101482878 B1 | 1/2015 |
| KR | 1020150039300 A | 4/2015 |
| KR | 1020160094878 A | 8/2016 |
| WO | 2013077220 | 5/2013 |

OTHER PUBLICATIONS

Daisuke Yokoyama et al., In situ real-time spectroscopic ellipsometry measurement for the investigation of molecular orientation in organic amorphous multilayer structures, 2010, 8 pages, 107, American Institute of Physics.

Jorg Frischeisen et al., Increased light outcoupling efficiency in dye-doped small molecule organic light-emitting diodes with horizontally oriented emitters, 2011, p. 809-817, 12, Organic Electronics, Elsevier.

International Search Report for PCT/KR2016/015127 dated Sep. 12, 2017.

Written Opinion for PCT/KR2016/015127 dated Sep. 12, 2017.

\* cited by examiner

FOLDABLE CIRCULAR POLARIZING PLATE AND DISPLAY DEVICE

TECHNICAL FIELD

A foldable circular polarizing plate and a display device are disclosed.

BACKGROUND ART

Commonly used panel displays may be classified into a light-emitting display device emitting light by itself and a non-emissive display device requiring a separate light source, and a compensation film such as a phase difference film is frequently employed for improving the image quality thereof.

In the case of the light emitting display device, for example, an organic light emitting diode ("OLED") display, visibility and a contrast ratio may be deteriorated by reflection of external light caused by a metal such as an electrode. In order to reduce this, the linear polarized light is shifted into circularly polarized light by using a polarizer and a compensation film, so that reflection of the external light by the organic light emitting diode display and leakage thereof to the outside may be prevented.

However, a currently developed compensation film does not match the ideal or desired phase difference, and thus reflected external light may leak out. Unlike a liquid crystal display ("LCD"), an OLED is expected to be used for foldable applications because of its favorable foldable characteristics.

DETAILED DESCRIPTION OF THE INVENTION

Technical Object

An embodiment provides a foldable circular polarizing plate capable of further improving an anti-reflection effect of external light in a foldable organic light emitting diode display.

Another embodiment provides a foldable compensation film applicable to a foldable organic light emitting diode display.

Another embodiment provides a display device including the foldable compensation film or the foldable circular polarizing plate.

Technical Solution

According to an embodiment, a foldable circular polarizing plate includes a polarizer and a foldable compensation film disposed on one surface of the polarizer and including a liquid crystal layer, wherein in-plane retardations of the liquid crystal layer at 450 nm, 550 nm, and 650 nm wavelengths satisfy Relationship Equation 1 or 2, the compensation film is configured to absorb light in a wavelength region of less than or equal to 420 nm, and a reflection color in a CIE-Lab color coordinate system satisfies $\Delta a^* b^* \leq 5.0$.

$$R_e(450\ nm) < R_e(550\ nm) \leq R_e(650\ nm) \quad \text{[Relationship Equation 1]}$$

$$R_e(450\ nm) \leq R_e(550\ nm) < R_e(650\ nm) \quad \text{[Relationship Equation 2]}$$

In Relationship Equation 1 or 2, $R_e$ (450 nm) is in-plane retardation of the liquid crystal layer for incident light of a 450 nm wavelength, $R_e$ (550 nm) is in-plane retardation of the liquid crystal layer for incident light of a 550 nm wavelength, and $R_e$ (650 nm) is in-plane retardation of the liquid crystal layer for incident light of a 650 nm wavelength.

The liquid crystal layer may include a liquid crystal configured to absorb light in a wavelength region of less than or equal to 420 nm.

The liquid crystal layer may include an additive configured to absorb light in a wavelength region of less than or equal to 420 nm.

The compensation film may include a light-absorbing film configured to absorb light in a wavelength region of less than or equal to 420 nm.

An absorption rate of light of a 400 nm wavelength of the compensation film may be greater than or equal to about 15%.

An absorption rate of light of a 400 nm wavelength of the compensation film may be greater than or equal to about 50%.

Transmittances of light of 400 nm and 550 nm wavelengths of the compensation film may satisfy Relationship Equation 3.

$$T_2/T_1 \leq 0.6 \quad \text{[Relationship Equation 3]}$$

In Relationship Equation 3, $T_1$ is a transmittance of light of a 550 nm wavelength of the compensation film, and $T_2$ is a transmittance of light of a 400 nm wavelength of the compensation film.

The compensation film may not substantially be configured to absorb light of a 430 nm to 780 nm region.

In-plane retardation for 550 nm of the compensation film may be about 110 nm to about 180 nm.

The compensation film may include a single liquid crystal layer.

According to another embodiment, an organic light emitting diode display includes an organic light emitting diode panel and a foldable circular polarizing plate disposed on one surface of the organic light emitting diode panel and including a polarizer and a compensation film, wherein the organic light emitting diode panel is configured to emit light of a first wavelength region, the compensation film includes a liquid crystal layer and is configured to absorb light of a shorter wavelength region than the first wavelength region, in-plane retardations of the liquid crystal layer at 450 nm, 550 nm, and 650 nm wavelengths satisfy Relationship Equation 1 or 2, a reflection color of the circular polarizing plate in a CIE-Lab color coordinate system satisfies $\Delta a^* b^* \leq 5.0$, and the organic light emitting diode display is foldable.

$$R_e(450\ nm) < R_e(550\ nm) \leq R_e(650\ nm) \quad \text{[Relationship Equation 1]}$$

$$R_e(450\ nm) \leq R_e(550\ nm) < R_e(650\ nm) \quad \text{[Relationship Equation 2]}$$

In Relationship Equation 1 or 2, $R_e$ (450 nm) is in-plane retardation of the liquid crystal layer for incident light of a 450 nm wavelength, $R_e$ (550 nm) is in-plane retardation of the liquid crystal layer for incident light of a 550 nm wavelength, and $R_e$ (650 nm) is in-plane retardation of the liquid crystal layer for incident light of a 650 nm wavelength.

The first wavelength region may be about 430 nm to about 780 nm.

The compensation film may not substantially be configured to absorb light of the first wavelength region.

The liquid crystal layer may include a liquid crystal configured to absorb light in a wavelength region of less than or equal to 420 nm.

The liquid crystal layer may include an additive configured to absorb light in a wavelength region of less than or equal to 420 nm.

The compensation film may include a light-absorbing film configured to absorb light in a wavelength region of less than or equal to 420 nm.

An absorption rate of light of a 400 nm wavelength of the compensation film may be greater than or equal to 15%.

An absorption rate of light of a 400 nm wavelength of the compensation film may be greater than or equal to 50%.

Transmittances of light of 400 nm and 550 nm wavelengths of the compensation film may satisfy Relationship Equation 3.

$$T_2/T_1 \leq 0.6 \quad \text{[Relationship Equation 3]}$$

In Relationship Equation 3, $T_1$ is a transmittance of light of a 550 nm wavelength of the compensation film, and $T_2$ is a transmittance of light of a 400 nm wavelength of the compensation film.

The compensation film may include a single liquid crystal layer.

In-plane retardation for 550 nm of the compensation film may be 110 nm to 180 nm.

Advantageous Effect

An anti-reflection effect of external light may be improved.

BEST MODE

Hereinafter, embodiments will hereinafter be described in detail so that a person skilled in the art would understand. However, embodiments may be embodied in many different forms and is not construed as being limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, referring to drawings, an organic light emitting diode display according to an embodiment is described.

Figure 1:
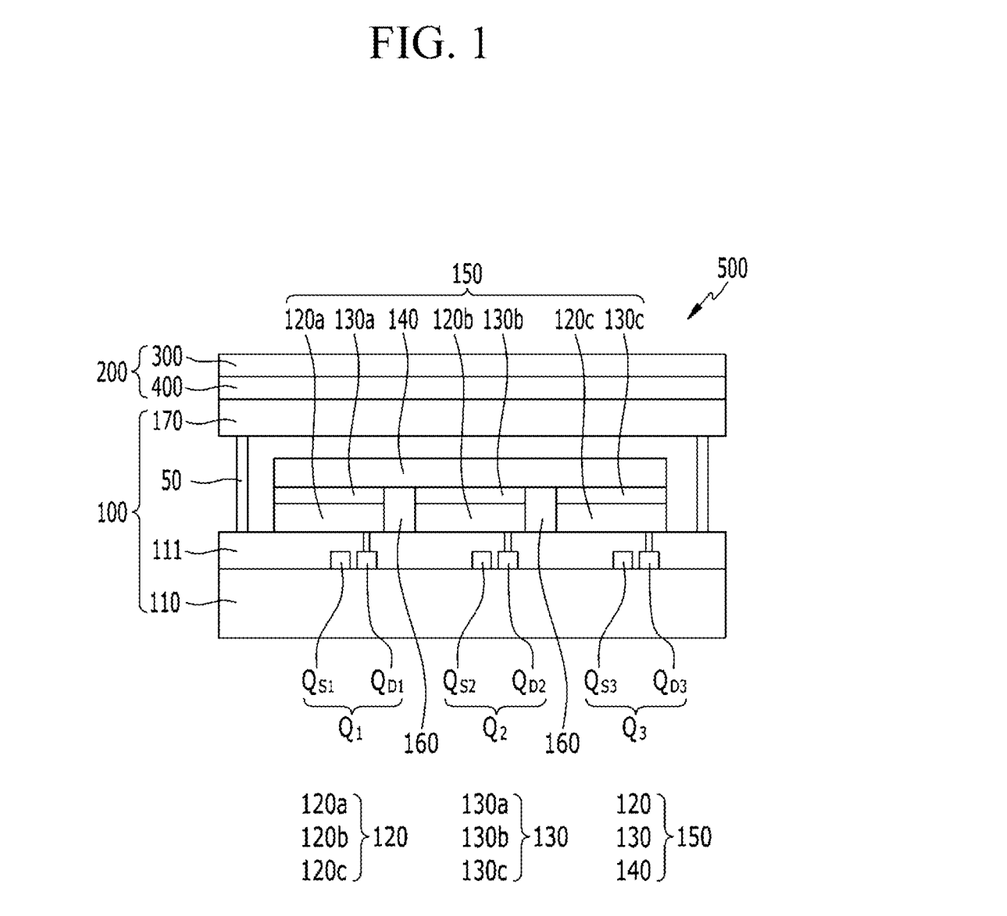
FIG. 1 is a cross-sectional view schematically showing an organic light emitting diode display according to an embodiment.

FIG. 1 is a cross-sectional view schematically showing an organic light emitting diode display according to an embodiment.

Referring to FIG. 1, an organic light emitting diode display 500 according to an embodiment includes an organic light emitting diode panel 100 and a circular polarizing plate 200.

The organic light emitting diode display 500 may be a foldable flexible device.

The organic light emitting diode panel 100 includes a plurality of unit pixel groups to display a full color, and the plurality of unit pixel groups may be disposed alternately along rows and/or columns. Each unit pixel group includes a plurality of pixels, and may have, for example various arrangements of a 2×2 matrix, a 3×1 matrix, and the like. Each unit pixel group may include, for example a red pixel, a green pixel, and a blue pixel, and may further include a white pixel. The structures and arrangement of the unit pixel group may be variously modified.

Referring to FIG. 1, an organic light emitting diode panel 100 includes a base substrate 110, thin film transistor arrays $Q_1$, $Q_2$, and $Q_3$, organic light emitting diode 150, and an opposed substrate 170 on the base substrate 110.

The base substrate 110 may be a glass substrate, a polymer substrate, or a semiconductor substrate. The polymer substrate may be, for example, polycarbonate, polymethylmethacrylate, polyethyleneterephthalate, polyethylenenaphthalate, polyamide, polyethersulfone, a copolymer thereof, a derivative thereof, or a combination thereof, but is not limited thereto. When a polymer substrate is used, a flexible device may be effectively implemented.

The thin film transistor arrays $Q_1$, $Q_2$, and $Q_3$ may include switching thin film transistors $Q_{S1}$, $Q_{S2}$, and $Q_{S3}$ and driving thin film transistors $Q_{D1}$, $Q_{D2}$, and $Q_{D3}$ in each pixel, and the switching thin film transistors $Q_{S1}$, $Q_{S2}$, and $Q_{S3}$ and driving thin film transistors $Q_{D1}$, $Q_{D2}$, and $Q_{D3}$ may be electrically connected to each other.

The switching thin film transistors $Q_{S1}$, $Q_{S2}$, and $Q_{S3}$ have a control terminal, an input terminal, and an output terminal, wherein the control terminal is connected to a gate line, the input terminal is connected to a data line, and the output terminal is connected to the driving thin film transistors $Q_{D1}$, $Q_{D2}$, and $Q_{D3}$. The switching thin film transistors $Q_{S1}$, $Q_{S2}$, and $Q_{S3}$ may respond to a scan signal applied to the gate line and deliver a data signal to the driving thin film transistors $Q_{D1}$, $Q_{D2}$, and $Q_{D3}$.

The driving thin film transistors $Q_{D1}$, $Q_{D2}$, and $Q_{D3}$ also have a control terminal, an input terminal, and an output terminal, wherein the control terminal is connected to the switching thin film transistors $Q_{S1}$, $Q_{S2}$, and $Q_{S3}$, the input terminal is connected to a driving voltage line, and the output terminal is connected to the organic light emitting diode 150. The driving thin film transistors $Q_{D1}$, $Q_{D2}$, and $Q_{D3}$ may shed an output current having a changing size depending on a voltage applied between the control terminal and the output terminal.

An insulation layer 111 is formed on the thin film transistor arrays $Q_1$, $Q_2$, and $Q_3$. The insulation layer 111 has a plurality of contact holes exposing a part of the switching thin film transistors $Q_{S1}$, $Q_{S2}$, and $Q_{S3}$ and the driving thin film transistors $Q_{D1}$, $Q_{D2}$, and $Q_{D3}$.

An organic light emitting diode 150 is formed on the insulation layer 111. The organic light emitting diode 150 may include a first organic light emitting diode displaying a first color, a second organic light emitting diode displaying a second color, and a third organic light emitting diode displaying a third color. The first color, the second color, and the third color may be one of three primary colors.

The organic light emitting diode 150 includes lower electrodes 120, organic layers 130, and an upper electrode 140. The lower electrodes 120 include a first lower electrode 120a, a second lower electrode 120b, and a third lower electrode 120c which are disposed in the first to third organic light emitting diodes, respectively, and the organic layers 130 includes an organic layer 130a emitting a first color, an organic layer 130b emitting a second color, and an organic layer 130c emitting a third color. The upper electrode 140 may be a common electrode commonly used in the first to third organic light emitting diodes. Among the first organic light emitting diode, the second organic light emitting diode, and the third organic light emitting diode, barrier ribs 160 made of an insulating material such as polyimide may be formed.

The lower electrode 120 is connected to the output terminal of the driving thin film transistors $Q_{D1}$, $Q_{D2}$, and $Q_{D3}$ and the upper electrode 140 is connected to a common voltage.

One of the lower electrode 120 and the upper electrode 140 may be an anode, and the other may be a cathode. For example, the lower electrode 120 may be an anode and the upper electrode 140 may be a cathode. The anode is an electrode into which holes are injected and may be made of a conductive material having a high work function, and the cathode is an electrode into which electrons are injected and may be made of a conductive material having a low work function.

At least one of the lower electrode 120 and the upper electrode 140 may be made of a transparent or semi-transparent conductive material from which emitted light exits outside, for example, a conductive oxide thin film such as ITO or IZO and/or a metal thin film such as an Ag or Al thin film.

The organic layer 130 includes an emission layer and may further include an auxiliary layer.

The emission layer may include organic materials that intrinsically emit light in a visible region of red, green, or blue when applying a voltage to the lower electrode 120 and the upper electrode 140. The emission layer may emit light in a first wavelength region, and the light in the first wavelength region may be, for example, about 430 nm to 780 nm. The emission layer may include, for example, a blue emission layer emitting blue light in a region of about 430 nm to 500 nm, a green emission layer emitting green light in a region of about 500 nm to 580 nm, and a red emission layer emitting red light in a region of about 580 nm to 780 nm.

The auxiliary layer may include a hole transporting layer, a hole injecting layer, an electron injecting layer, and/or an electron transporting layer to balance electrons and holes, but is not limited thereto. The organic layer 130 may include organic molecules substantially oriented in one direction, wherein the organic molecules may be deposited, for example, vacuum-deposited.

FIG. 1 shows that the organic layer 130 is separated in each pixel but is not limited thereto and may be formed as a common layer in the organic light emitting diode 150, for example, stacked emission layers including an emission layer displaying first color, an emission layer displaying second color, and an emission layer displaying third color. Herein, the organic light emitting diode panel 100 may further include a color filter (not shown) under or on the organic layer 130.

The opposed substrate 170 may be, for example, an encapsulation substrate. The encapsulation substrate may be made of glass, metal, or a polymer, the polymer may be, for example polyethyleneterephthalate (PET), polyvinylalcohol (PVA), polycarbonate (PC), triacetyl cellulose (TAC), a copolymer thereof, a derivative thereof, and/or a combination thereof. The encapsulation substrate may seal the organic light emitting diodes 150 and prevent the inflow of moisture and/or oxygen from the outside. The base substrate 110 and the opposed substrate 170 may be bonded by a sealing material 50.

FIG. 1 shows one example structure of the organic light emitting diode panel 100, but the structure of the organic light emitting diode panel 100 may be various, and any known organic light emitting diode panel may be applied.

The circular polarizing plate 200 may be disposed on one surface of the organic light emitting diode panel 100 and may be disposed on the light-emitting side of the organic light emitting diode panel 100. FIG. 1 shows a top emission structure where light emits at the side of the opposed substrate 170 and the circular polarizing plate 200 is disposed on one surface of the opposed substrate 170, but it is not limited thereto. When it has a bottom emission structure where light emits at the side of the base substrate 110, the circular polarizing plate 200 may be disposed on an external surface of the base substrate 110.

The circular polarizing plate 200 may be a foldable circular polarizing plate.

The circular polarizing plate 200 includes a polarizer 300 and a compensation film 400.

The polarizer 300 may be a linear polarizer to convert externally incident light (hereinafter, referred to as "incident light") into linear polarized light.

The polarizer 300 may be, for example a polarizer made of polyvinylalcohol (PVA), and the polarizer may be formed according to a method of, for example, elongating a polyvinyl alcohol film, adsorbing iodine or a dichroic dye thereto, and treating it with boric acid and washing the same.

The polarizer 300 may be, for example, a polarizing film prepared by melt-blending a polymer and a dichroic dye, and the polarizing film may be, for example, made by blending a polymer and a dichroic dye and melting the mixture at a temperature above the melting point of the polymer to manufacture the polarizer 300 in a form of a sheet. The polymer may be a hydrophobic polymer, for example polyolefin.

The compensation film 400 may circularly-polarize linearly polarized light passed through the polarizer 300 to generate a phase difference and may be, for example a λ/4 plate. The λ/4 plate may have, for example, an in-plane retardation ($R_e$) of about 110 nm to about 180 nm for incident light of 550 nm wavelength (hereinafter referred to as 'reference wavelength').

The compensation film 400 may be a foldable compensation film.

The compensation film 400 may include a liquid crystal layer, and optionally include a substrate and/or an alignment layer.

The substrate may be, for example, a glass substrate or a polymer substrate. The polymer substrate may have optical isotropic properties and may be a substrate made of, for example polyethyleneterephthalate (PET), polyvinyl alcohol (PVA), polycarbonate (PC), triacetyl cellulose (TAC), a derivative thereof, and/or a combination thereof, but is not limited thereto. The substrate may be omitted as needed.

The alignment layer may impart a pretilt angle to liquid crystals of the liquid crystal layer which will be described later and thus control alignment of the liquid crystals, and for example, may be formed of polyvinyl alcohol, polyolefin, polyamic acid, polyimide, or a combination thereof. The surface of the alignment layer may have a capability of aligning liquid crystals through a physical treatment such as rubbing or a photo-treatment such as photo-alignment. The alignment layer may be omitted as needed.

The liquid crystal layer may include liquid crystals having optical anisotropy.

The liquid crystal may be, for example, a rod-shaped nematic liquid crystal and may have a positive or negative birefringence (Δn).

The liquid crystal may be a reactive mesogenic liquid crystal, and may have, for example, at least one mesogenic moiety and at least one polymerizable functional group. The reactive mesogenic liquid crystal may include at least one of, for example, a rod-shaped aromatic derivative having at least one polymerizable functional group, propylene glycol 1-methyl, propylene glycol 2-acetate, and a compound represented by $P^1-A^1-(Z^1-A^2)_n-P^2$ (wherein $P^1$ and $P^2$ may independently include acrylate, methacrylate, acryloyl vinyl, vinyloxy, epoxy, or a combination thereof as a polymerizable functional group, $A^1$ and $A^2$ may independently include 1,4-phenylene, a naphthalene-2,6-diyl group, or a combination thereof, $Z^1$ may include a single bond, —COO—, —OCO—, or a combination thereof, and n may be 0, 1, or 2), but is not limited thereto.

The liquid crystal may be a thermal curable liquid crystal or a photocurable liquid crystal. In an embodiment, the liquid crystal may be a photocurable liquid crystal. When the liquid crystal is the photocurable liquid crystal, the light may be ultraviolet light of a wavelength of about 250 nm to about 400 nm.

The liquid crystal layer may be formed from a liquid crystal composition including the liquid crystals, wherein the liquid crystal composition may include a variety of additives such as a reaction initiator, a surfactant, a dissolution auxiliary agent, and/or a dispersing agent and a solvent in addition to the liquid crystal. The liquid crystal composition may be applied by a coating process such as spin coating, slit coating and/or inkjet coating, and a drying may be further performed, if needed, after the coating.

The compensation film 400 may be a single layer and may include a single liquid crystal layer. Accordingly, in-plane retardation of the compensation film 400 may be substantially the same as in-plane retardation of the liquid crystal layer.

The liquid crystal layer may have different in-plane retardation depending upon a wavelength, for example, the in-plane retardation for light in a long wavelength may be higher than the in-plane retardation for light in a short wavelength.

In-plane retardations of the liquid crystal layer for a light of 450 nm, 550 nm, and 650 nm wavelengths may, for example, satisfy Relationship Equations 1 or 2.

$$R_e(450\ nm) < R_e(550\ nm) \le R_e(650\ nm) \quad \text{[Relationship Equation 1]}$$

$$R_e(450\ nm) \le R_e(550\ nm) < R_e(650\ nm) \quad \text{[Relationship Equation 2]}$$

In Relationship Equations 1 or 2, $R_e$ (450 nm) is in-plane retardation of the liquid crystal layer for incident light of a 450 nm wavelength, $R_e$ (550 nm) is in-plane retardation of the liquid crystal layer for incident light of a 550 nm wavelength, and $R_e$ (650 nm) is in-plane retardation of the liquid crystal layer for incident light of a 650 nm wavelength.

By including the liquid crystal layer satisfying Relationship Equations 1 or 2, the wavelength dependency may be reduced, so as to effectively perform external light anti-reflection functions.

Meanwhile, the compensation film 400 may absorb light in a wavelength region of less than or equal to about 420 nm, so that the anti-reflection effects may be further effectively obtained by compensating the anti-reflection functions to light in a short wavelength region.

Figure 2:
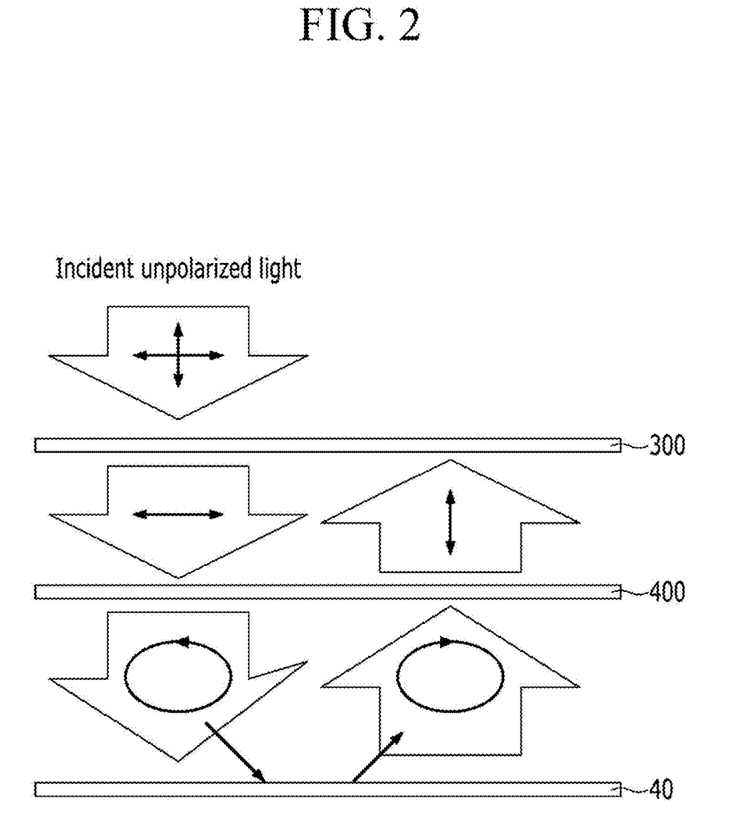
FIG. 2 is a schematic view showing an external light anti-reflection effect of a circular polarizing plate.

FIG. 2 is a schematic view showing an external light anti-reflection effect of a circular polarizing plate.

Referring to FIG. 2, while the incident unpolarized light (hereinafter referred to as "external light") having entered from the outside is passed through the polarizer 300 and the polarized light is shifted into circularly polarized light by passing through the compensation film 400, only a first polarized perpendicular component, which is one polarized perpendicular component of two polarized perpendicular components, is transmitted. While the circularly polarized light is reflected by a metal electrode included in the organic light emitting diode panel 100, and changes the circular polarization direction, and the circularly polarized light is passed through the compensation film 400, only a second polarized perpendicular component, which is the other polarized perpendicular component of the two polarized perpendicular components, may be transmitted. As the second polarized perpendicular component is not passed through the polarizer 300, and light does not exit to the outside, effects of preventing the external light reflection may be provided.

Meanwhile, the present inventors found that light is leaked by the insufficient external light anti-reflection effect for a light in a predetermined wavelength region, and found that the light leakage occurred with respect to light in a short wavelength region of, particularly, less than or equal to 420 nm, to be a bluish color. As described above, as the compensation film 400 absorbs light in a short wavelength region of less than or equal to about 420 nm, the light leakage may be suppressed to improve a reflection color.

For example, the liquid crystal layer of the compensation film 400 may absorb light in a shorter wavelength region than the light in the first wavelength region emitted from the organic light emitting diode panel 100. For example, the liquid crystal layer of the compensation film 400 may absorb light in a short wavelength region of less than or equal to about 420 nm. For example, the liquid crystals included in the liquid crystal layer may absorb light in a short wavelength region of less than or equal to about 420 nm. For example, the additives such as a reaction initiator, a surfactant, a dissolution auxiliary agent, and/or a dispersing agent included in the liquid crystal layer may absorb light in a short wavelength region of less than or equal to about 420 nm.

For example, the compensation film 400 may include a light-absorbing member absorbing light in a shorter wavelength region than the light in the first wavelength region emitted from the organic light emitting diode panel 100. For example, the compensation film 400 may include a light-absorbing member absorbing light in a short wavelength region of less than or equal to about 420 nm. The light-absorbing member may be, for example, a light-absorbing film, but the shape thereof is not particularly limited. The light-absorbing member may be disposed in a place where light reflected from the organic light emitting diode panel 100 is passed through.

The compensation film 400 may absorb light in a short wavelength region of less than or equal to about 420 nm, for example, the absorptance of light of about 400 nm wavelength may be greater than or equal to about 15%. The absorptance of light of about 400 nm wavelength may be, for example, about 15% to 100%, within the range, for example, about 50% to 100%.

Transmittances of light of 400 nm and 550 nm wavelengths of the compensation film 400 may, for example, satisfy Relationship Equation 3.

$$T_2/T_1 \leq 0.6 \quad \text{[Relationship Equation 3]}$$

In Relationship Equation 3, $T_1$ is a transmittance of light of a 550 nm wavelength of the compensation film, and $T_2$ is a transmittance of light of a 400 nm wavelength of the compensation film.

The transmittances of light of 400 nm and 550 nm wavelengths of the compensation film 400 may, for example, satisfy Relationship Equation 3a.

$$T_2/T_1 \leq 0.5 \quad \text{[Relationship Equation 3a]}$$

The transmittances of light of 400 nm and 550 nm wavelengths of the compensation film 400 may for example satisfy Relationship Equation 3aa.

$$T_2/T_1 \leq 0.4 \quad \text{[Relationship Equation 3aa]}$$

The compensation film 400 may not substantially absorb light in a region of 430 nm to 780 nm, and a transmittance for light in about 430 nm to 780 nm of the compensation film 400 may be about 98% to 100%, within the range, for example about 99% to 100%, based on 100% of the transmittance of the based substrate 110. As in above, the compensation film 400 may prevent loss of blue light, green light, and red light emitted from the organic light emitting diode panel 100 by transmitting light in a visible region substantially as it is.

By including the compensation film 400 absorbing light in a short wavelength region of less than or equal to about 420 nm, the organic light emitting diode display 500 may substantially prevent the light leakage of light in a short wavelength region having insufficient external light anti-reflection effects, so that it may obtain the more effective circularly polarization effect for the entire wavelength region. Thereby it may improve the reflection color expressing a color by reflecting external light, so that the display characteristics of the organic light emitting diode display may be improved.

The reflection color of the circular polarizing plate 400 may be shown using a CIE-Lab color coordinate system. In the CIE-Lab color coordinate system, a positive number of a value refers to red, a negative number of a value refers to green, a positive number of b* value refers to yellow, and a negative number of b* value refers to blue. The reflection color is going darker as an absolute value of a* and b* is higher.

The reflection color of the circular polarizing plate 200 may satisfy, for example, $\Delta a^* b^* \leq 5.0$. The ranged reflection color may not be a bluish color, but may be substantially neutral gray. Within the range, the ranged reflection color may satisfy, for example, $\Delta a^* b^* \leq 4.8$, within the range, may satisfy, for example, $\Delta a^* b^* \leq 4.5$, within the range, may satisfy, for example, $\Delta a^* b^* \leq 4.2$, within the range, may satisfy, for example, $\Delta a^* b^* \leq 4.0$, within the range, may satisfy, for example, $\Delta a^* b^* \leq 3.8$, within the range, may satisfy, for example, $\Delta a^* b^* \leq 3.5$. Within the range of the reflection color, the external light reflection may be substantially reduced, so as to improve a visibility of the organic light emitting diode display. For example, within the range of the reflection color, the organic light emitting diode display may have a reflectance of less than or equal to about 10%, for example, less than or equal to about 8%, or less than or equal to about 5%.

MODE FOR INVENTION

The embodiments described above will be described in more detail by way of examples. However, these examples are exemplary, and the present disclosure is not limited thereto.

Preparation of Liquid Crystal Material

Four kinds of polymerizable liquid crystals (manufactured by DIC Corporation) having the characteristics shown in Table 1 are prepared.

TABLE 1

| No. | DIC Company | $R_e$(450 nm) | $R_e$(550 nm) | $R_e$(650 nm) |
|---|---|---|---|---|
| Liquid Crystals 1 | UCL-031R3 | 119 nm | 138 nm | 140 nm |
| Liquid Crystals 2 | UCL-031R5 | 125 nm | 138 nm | 139 nm |
| Liquid Crystals 3 | UCL-031R14 | 119 nm | 138 nm | 141 nm |
| Liquid Crystals 4 | UCL-031R17 | 120 nm | 138 nm | 140 nm |

Manufacture of Compensation Film

Example 1

A photo-alignment material (PAM-0021, manufactured by DIC Corporation) is spin-coated on a TAC film and dried at 80° C. for 3 minutes and then irradiated with a polarized UV light at 100 mJ/cm² to provide a photo-alignment layer. Subsequently, Liquid Crystals 1 are spin-coated on the photo-alignment layer and dried at 80° C. for 2 minutes and cooled down until a room temperature, and then is irradiated with UV light at 600 mJ/cm² to provide a liquid crystal layer having a thickness of 2.0 μm, so a compensation film is prepared.

Example 2

A compensation film is prepared in accordance with the same procedure as in Example 1, except that Liquid Crystals 2 are used instead of the Liquid Crystal 2.

Example 3

A compensation film is prepared in accordance with the same procedure as in Example 1, except that Liquid Crystals 3 are used instead of the Liquid Crystals 1.

Example 4

A compensation film is prepared in accordance with the same procedure as in Example 1, except that Liquid Crystals 4 are used instead of the Liquid Crystals 1.

Comparative Example 1

A compensation film available in a market (Teijin, WRS-142) is prepared.

Evaluation 1

The transmittances according to wavelengths of the compensation films of Examples 1 to 4 are measured. The transmittances are measured using CM3600d (manufactured by Konica Minolta, Inc.).

Figure 3:
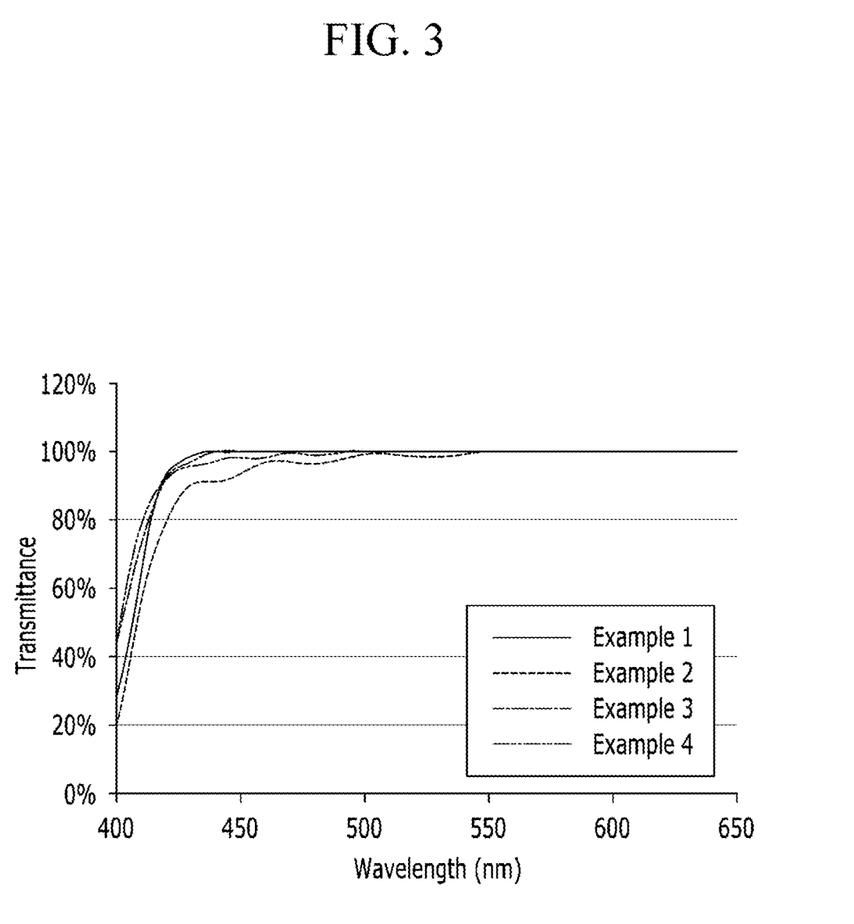
FIG. 3 is a graph showing light transmittances according to wavelengths of the compensation films according to Examples 1 to 4.

The results are shown in FIG. 3.

FIG. 3 is a graph showing transmittances according to wavelengths of the compensation films of Example 1 to 4.

In FIG. 3, the transmittances are normalized at a transmittance of 100% at 550 nm.

Referring to FIG. 3, it is confirmed that the compensation films of Examples 1 to 4 show a low transmittance of a light in a wavelength region of less than or equal to about 420 nm, thus it is confirmed that the compensation films of Examples 1 to 4 may absorb light in a wavelength region of less than or equal to about 420 nm. Meanwhile, it is confirmed that the compensation films of Examples 1 to 4 may transmit light in a wavelength region of greater than or equal to about 450 nm which is a wavelength region of light emitted from the organic light emitting diode panel at almost 100%.

Manufacture of Organic Light Emitting Diode Display

Example 5

A pressure-sensitive adhesive is coated on an organic light emitting diode panel (Galaxy S4, Samsung), and the compensation film of Example 1 and a polarizer (SEG1425DU, manufactured by Nitto Denko Corporation) are sequentially laminated to provide an organic light emitting diode display.

Example 6

An organic light emitting diode display is manufactured in accordance with the same procedure as in Example 5, except the compensation film of Example 2 is used instead of the compensation film of Example 1.

Example 7

An organic light emitting diode display is manufactured in accordance with the same procedure as in Example 5, except the compensation film of Example 3 is used instead of the compensation film of Example 1.

Example 8

An organic light emitting diode display is manufactured in accordance with the same procedure as in Example 5, except the compensation film of Example 4 is used instead of the compensation film of Example 1.

Comparative Example 2

An organic light emitting diode display is manufactured in accordance with the same procedure as in Example 5, except the compensation film of Comparative Example 1 is used instead of the compensation film of Example 1.
Evaluation 2

The reflection colors of the organic light emitting diode displays of Examples 5 to 8 and Comparative Example 2 are evaluated.

The reflection colors are evaluated using a spectrophotometer (CM-3700d, Konica Minolta Inc.) while supplying light under the conditions of a light source of D65, a reflection of 8 degrees, and a light-receiving part of 2 degrees.

The reflection colors are expressed by an a* value, which is a horizontal axis, and a b* value, which is a vertical axis in CIE-Lab color coordinate system. A positive number of the a* value refers to red, a negative number of the a value refers to green, a positive number of the b* value refers to yellow, and a negative number of b* value refers to blue, and the color is going darker as an absolute value of a* and b* is higher. The color shift is going better as Δa*b* is lower.

The results are shown in Table 2.

TABLE 2

|  | Δa*b* |
|---|---|
| Example 5 | 2.1 |
| Example 6 | 2.0 |
| Example 7 | 3.3 |
| Example 8 | 3.1 |
| Comparative Example 2 | 5.2 |

Referring to Table 2 above, it is confirmed that the reflection color of the organic light emitting diode display of Examples 5 to 8 is significantly lowered, compared to the organic light emitting diode display according to Comparative Example 2.

Simulation Evaluation I

Examples 9 to 11 and Comparative Examples 3 to 5

The compensation film applied with liquid crystal having light absorption characteristics and the compensation film applied with liquid crystal having no light absorption characteristics are subjected to a simulation evaluation for monitoring the reflection color change.

Liquid crystals having light absorption characteristics use the light transmittance data of Liquid Crystals 1, 2, and 3 (See Table 1 above.). Liquid crystals having no light absorption characteristics are referred as Liquid Crystals A, B and C, respectively, supposing that a transmittance in a wavelength region of less than or equal to about 420 nm is 100% in the transmittance data of Liquid Crystals 1, 2 and 3.

The simulation evaluation results are shown in Table 3 below.

TABLE 3

|  | Compensation film (liquid crystal) | Polarizer | a* | b* | Δ a*b* |
|---|---|---|---|---|---|
| Example 9 | Liquid Crystals 1 (UCL-031R3) | PVA | 2.1 | −4.0 | 4.5 |
| Comparative Example 3 | Liquid Crystals A | PVA | 2.3 | −5.6 | 6.1 |
| Example 10 | Liquid Crystals 2 (UCL-031R5) | PVA | 2.7 | −3.4 | 4.3 |
| Comparative Example 4 | Liquid Crystals B | PVA | 3.4 | −4.2 | 5.4 |
| Example 11 | Liquid Crystals 3 (UCL-031R14) | PVA | 2.9 | −3.7 | 4.7 |
| Comparative Example 5 | Liquid Crystals C | PVA | 3.6 | −5.4 | 6.5 |

*PVA: polyvinyl alcohol/dye polarizer (thickness: 60 μm)

Referring to Table 3, it is confirmed that the circular polarizing plate using liquid crystal having light absorption characteristics may sufficiently lower the reflection color, compared to the circular polarizing plate using liquid crystal having no absorption characteristics.

Simulation Evaluation II

Example 12

For the simulation evaluation, a structure of the organic light emitting diode display is assumed to be that of the compensation film made of the Liquid Crystals 1 attached to the organic light emitting diode panel (Galaxy S4, Samsung), and wavelength distributions of light (Reference Example) emitted from the organic light emitting diode panel and light passed through the compensation film are evaluated.

Example 13

For the simulation evaluation, a structure of the organic light emitting diode display is assumed to be that of the compensation film made of the Liquid Crystals 2 formed on the organic light emitting diode panel (Galaxy S4, Samsung), and wavelength distributions of light (Reference Example) emitted from the organic light emitting diode panel and light passed through the compensation film are evaluated.

Figure 4:
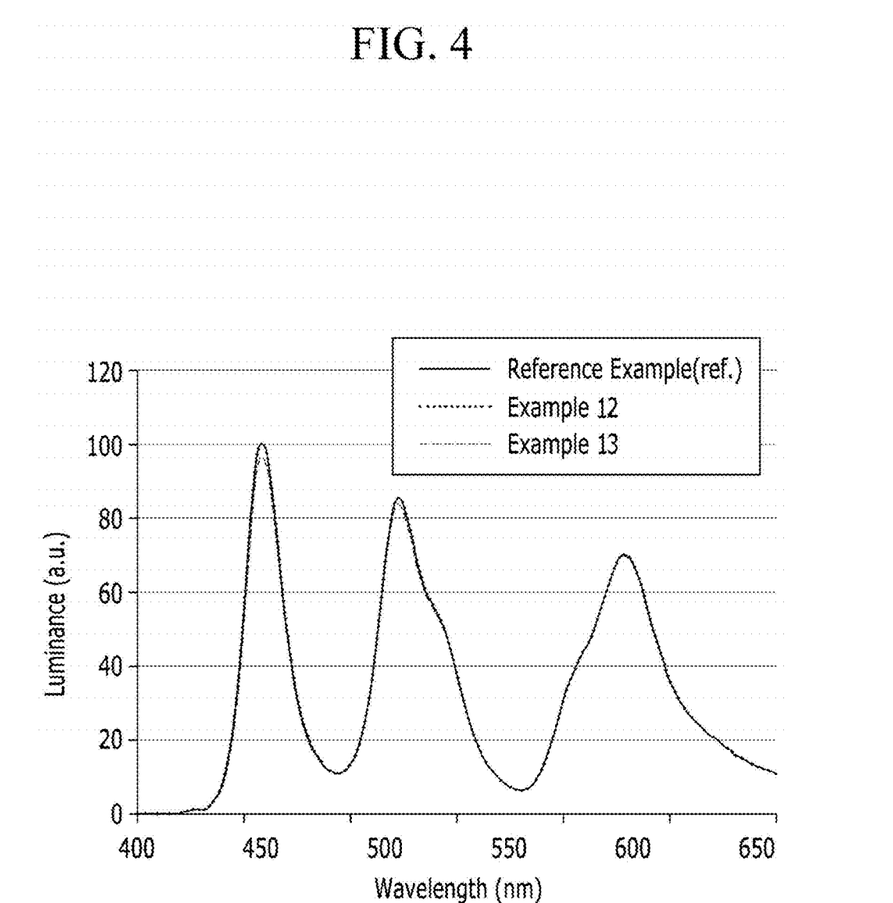
FIG. 4 is a graph showing light emitting characteristics according to the wavelength of the organic light emitting diode display according to Examples 12 and 13.

FIG. 4 is a graph showing light emitting characteristics according to the wavelength of organic light emitting diode display of Examples 12 and 13.

Referring to FIG. 4, it is understood that the organic light emitting diode displays according to Examples 12 and 13 show the substantially equivalent light emitting characteristics of the organic light emitting diode display according to a Reference Example. Thereby, it is confirmed that the compensation films prepared from Liquid Crystals 1 or 2 do not have influence on light emitted from the organic light emitting diode panel. Thus, the compensation film may transmit light in a visible region substantially as is and unchanged, so that it may prevent loss of blue light, green light, and red light emitted from the organic light emitting diode panel.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

The invention claimed is:

1. A foldable circular polarizing plate, comprising:
a polarizer, and
a compensation film disposed on one surface of the polarizer and including a liquid crystal layer, wherein the compensation film is foldable,
wherein in-plane retardations of the liquid crystal layer at 450 nm, 550 nm, and 650 nm wavelengths satisfy Relationship Equations 1 or 2,
the liquid crystal layer of the compensation film comprises a liquid crystal compound configured to absorb light in a wavelength region of 400 nm to 420 nm, and
a reflection color in a CIE-Lab color coordinate system satisfies $\Delta a^* b^* \leq 5.0$:

$$R_e(450\ nm) < R_e(550\ nm) < R_e(650\ nm) \quad \text{[Relationship Equation 1]}$$

$$R_e(450\ nm) < R_e(550\ nm) < R_e(650\ nm) \quad \text{[Relationship Equation 2]}$$

wherein, in Relationship Equations 1 or 2,
$R_e$ (450 nm) is in-plane retardation of the liquid crystal layer for incident light of a 450 nm wavelength,
$R_e$ (550 nm) is in-plane retardation of the liquid crystal layer for incident light of a 550 nm wavelength, and
$R_e$ (650 nm) is in-plane retardation of the liquid crystal layer for incident light of a 650 nm wavelength.

2. The foldable circular polarizing plate of claim 1, wherein an absorption rate of light of a 400 nm wavelength of the compensation film is greater than or equal to 15%.

3. The foldable circular polarizing plate of claim 1, wherein an absorption rate of light of a 400 nm wavelength of the compensation film is greater than or equal to 50%.

4. The foldable circular polarizing plate of claim 1, wherein transmittances of light of 400 nm and 550 nm wavelengths of the compensation film may satisfy Relationship Equation 3:

$$T_2/T_1 \leq 0.6 \quad \text{[Relationship Equation 3]}$$

wherein, in Relationship Equation 3,
$T_1$ is a transmittance of light of a 550 nm wavelength of the compensation film, and
$T_2$ is a transmittance of light of a 400 nm wavelength of the compensation film.

5. The foldable circular polarizing plate of claim 1, wherein the compensation film does not substantially absorb light of a 430 nm to 780 nm region.

6. The foldable circular polarizing plate of claim 1, wherein in-plane retardation for 550 nm of the compensation film is 110 nm to 180 nm.

7. The foldable circular polarizing plate of claim 1, wherein the compensation film comprises a single liquid crystal layer.

8. A light emitting diode display comprising
an organic light emitting diode panel, and
a foldable circular polarizing plate disposed on one surface of the organic light emitting diode panel, and comprising a polarizer and a compensation film,
wherein the organic light emitting diode panel is configured to emit light of a first wavelength region,
the compensation film comprises a liquid crystal layer, wherein the liquid crystal layer of the compensation film comprises a liquid crystal compound configured to absorb light in a wavelength region of 400 nm to 420 nm,
in-plane retardations of the liquid crystal layer at 450 nm, 550 nm, and 650 nm wavelengths satisfy Relationship Equations 1 or 2,
a reflection color of the circular polarizing plate in a CIE-Lab color coordinate system satisfies $\Delta a^* b^* \leq 5.0$, and
the organic light emitting diode display is foldable:

$$R_e(450\ nm) < R_e(550\ nm) \leq R_e(650\ nm) \quad \text{[Relationship Equation 1]}$$

$$R_e(450\ nm) \leq R_e(550\ nm) < R_e(650\ nm) \quad \text{[Relationship Equation 2]}$$

wherein, in Relationship Equations 1 or 2,
$R_e$ (450 nm) is in-plane retardation of the liquid crystal layer for incident light of a 450 nm wavelength,
$R_e$ (550 nm) is in-plane retardation of the liquid crystal layer for incident light of a 550 nm wavelength, and
$R_e$ (650 nm) is in-plane retardation of the liquid crystal layer for incident light of a 650 nm wavelength.

9. The light emitting diode display of claim 8, wherein the first wavelength region is 430 nm to 780 nm.

10. The organic light emitting diode display of claim 9, wherein the compensation film does not substantially absorb light of the first wavelength region.

11. The organic light emitting diode display of claim 8, wherein an absorption rate of light of a 400 nm wavelength of the compensation film is greater than or equal to 15%.

12. The organic light emitting diode display of claim 8, wherein an absorption rate of light of a 400 nm wavelength of the compensation film is greater than or equal to 50%.

13. The organic light emitting diode display of claim 8, wherein transmittances of light of 400 nm and 550 nm wavelengths of the compensation film satisfy Relationship Equation 3, $$T_2/T_1 \leq 0.6 \qquad \text{[Relationship Equation 3]}$$

wherein, in Relationship Equation 3, $T_1$ is a transmittance of light of a 550 nm wavelength of the compensation film, and $T_2$ is a transmittance of light of a 400 nm wavelength of the compensation film.

14. The organic light emitting diode display of claim 8, wherein the compensation film comprises a single liquid crystal layer, and in-plane retardation for 550 nm of the compensation film is 110 nm to 180 nm.

\* \* \* \* \*